United States Patent [19]
Lee et al.

[11] Patent Number: 5,920,511
[45] Date of Patent: Jul. 6, 1999

[54] HIGH-SPEED DATA INPUT CIRCUIT FOR A SYNCHRONOUS MEMORY DEVICE

[75] Inventors: Sang-bo Lee, Yongin; Jung-bae Lee, Gunpo, both of Rep. of Korea

[73] Assignee: Samsung Electronics Co., Ltd., Suwon, Rep. of Korea

[21] Appl. No.: 08/996,192

[22] Filed: Dec. 22, 1997

[51] Int. Cl.[6] .................................................. G11C 16/04
[52] U.S. Cl. .................... 365/189.05; 365/192; 365/233; 365/239
[58] Field of Search .................. 365/189.05, 189.01, 365/233, 239, 236, 192

[56] References Cited

U.S. PATENT DOCUMENTS 5,610,864  3/1997  Manning .................................. 365/193

*Primary Examiner*—David Nelms
*Assistant Examiner*—Thong Le
*Attorney, Agent, or Firm*—William L. Geary, Jr.

[57] ABSTRACT

A data input circuit for a semiconductor memory device uses an echo clock generator to reduce the clock cycle time. The echo clock is transmitted in the memory device with the data, thereby reducing the effects of clock skew and increasing the overall device operation speed. The circuit is particularly applicable to double data rate synchronous DRAM (DDR-SDRAM) circuitry.

49 Claims, 12 Drawing Sheets

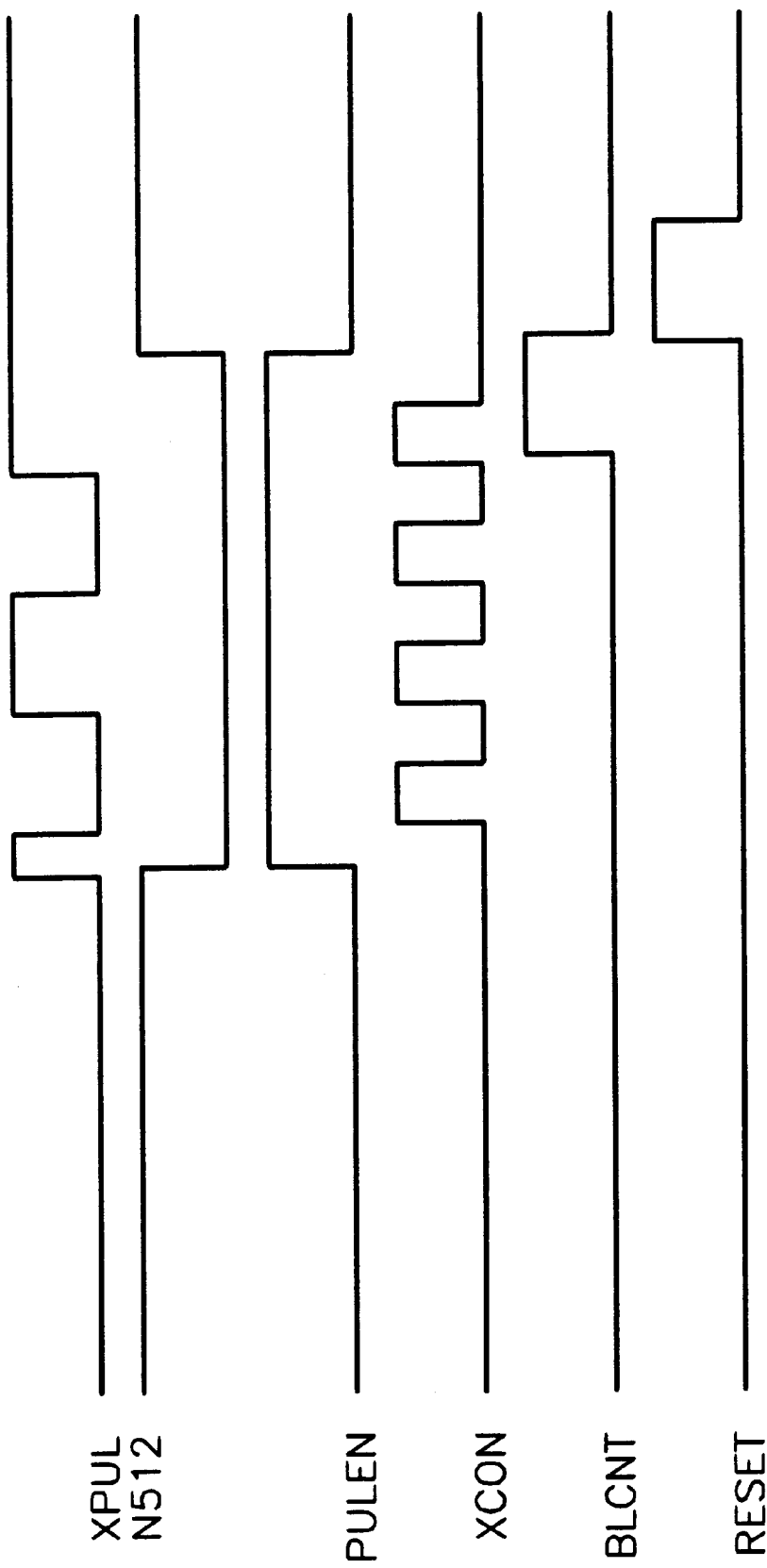

HIGH-SPEED DATA INPUT CIRCUIT FOR A SYNCHRONOUS MEMORY DEVICE

BACKGROUND OF THE INVENTION

1. Field of the Invention

The present invention relates to a data input circuit for a semiconductor memory device, and more particularly, to a data input circuit including an echo clock generator which reduces the clock cycle time in a synchronous semiconductor memory device. When this circuit is used in a synchronous dynamic random access memory (SDRAM), it may be called a Double Data Rate SDRAM (DDR-SDRAM). The circuit also may be used in other types of DRAM, and in other memory interfaces and memory devices such as static RAM (SRAM), flash memory, ferro-electric RAM (FRAM), and the like.

2. Description of the Related Art

In general, a computer system includes a central processing unit (CPU) for executing instructions for a given job, and a main memory for storing data and programs required by the CPU. Thus, in order to improve the performance of the computer system, it is necessary to improve the operating speed of the CPU and reduce the access time to the main memory. Accordingly, a double data rate synchronous dynamic random access memory (DDR-SDRAM) has been developed, which operates under the control of a system clock so that the main memory may be accessed very quickly.

FIG. 1 is a block diagram of a conventional data input/output circuit, in which data from an external source is input to a memory device via a data input buffer.

FIG. 2 is a diagram showing the various times that limit the clock cycle time $t_{CC}$ in a conventional data input circuit. Here, CLK_SYS represents the waveform of a system clock, CLK_CNTR represents the waveform of the system clock input to a memory controller, CLK_DRAM represents the waveform of the system clock input to a DRAM, DATA_DRAM represents data output from the DRAM, and DATA_CNTR represents data output by the controller. CLK_CNTR and CLK_DRAM are the same as the system clock CLK_SYS, but they are skewed because of the physical distances between the source that generates CLK_SYS, the controller, and the DRAM.

Generally, the operation of the SDRAM is controlled in response to a clock signal generated by a system clock. Referring to FIG. 2, it may be seen that the clock cycle time $t_{CC}$ of the SDRAM is restricted by various factors. The clock cycle time $t_{CC}$ is determined and limited by the sum of the following times: the time difference $t_{SW}$ between the minimum time required for a writing operation of the memory and a clock cycle of the data input to a data controller, the time $t_{AC}$ from the clock synchronization to a data output, the time $t_{FL}$ required for transferring data from a memory to a controller, and a data set-up time $t_{SS}$ by the controller.

Therefore, $t_{CC}$ imposes a limitation on the system, in that $t_{CC}$ must be greater than the sum of $t_{SW}$, $t_{AC}$, $t_{FL}$, and $t_{SS}$. These limitations make it difficult to implement a SDRAM having a frequency of 300 MHz or greater using a conventional data input circuit.

SUMMARY OF THE INVENTION

To solve the above problem, it is an object of the present invention to provide a data input circuit for a synchronous semiconductor memory device that is capable of reducing the clock cycle time.

Accordingly, to achieve the above object, there is provided an input circuit for a semiconductor memory device comprising: a data input buffer receiving input data and outputting buffered input data; an echo clock generator receiving a data clock at a frequency and sequentially generating an echo clock at twice the frequency; and an input data transmission circuit receiving the buffered input data and the echo clock and generating clocked input data synchronously with the echo clock. The echo clock generator further receives an enable signal for enabling the generation of the echo clock; and a burst length count for determining a number of echo clocks sequentially generated by the echo clock generator, and the echo clock generator further comprises: an echo clock buffer for generating a buffered data clock signal in response to the data clock and the enable signal; a burst length counter, receiving the burst length count and the echo clock, for counting the number of sequential echo clocks and generating a burst end signal when the number of sequential echo clocks corresponds to the burst length count; a burst clock generator, responsive to the buffered data clock signal and the burst end signal, for generating the number of sequential echo clocks corresponding to the burst length count; and a reset circuit for resetting the burst length counter when the number of sequential echo clocks corresponding to the burst length count has been generated. The burst clock generator comprises: a latch circuit having inputs coupled to the buffered data clock signal and the burst end signal and an output that generates a pulse enable signal; and an echo pulse generator for generating the number of sequential echo clocks corresponding to the burst length count in response to the buffered data clock signal and the pulse enable signal. The echo clock buffer comprises: a lower current mirror circuit for detecting the voltage of the data clock based on a lower reference voltage, and producing a first output signal; an upper current mirror circuit for detecting the voltage of the data clock based on an upper reference voltage which is higher than the lower reference voltage, and producing a second output signal; and a buffer latch circuit coupled to the first and second output signals, for generating the buffered data clock signal, wherein the buffered data clock signal is transited when the voltage of the data clock decreases to below the lower reference voltage or increases to above the upper reference voltage. The burst length counter comprises: a counting signal generator circuit for counting the echo clock and generating a plurality of counting signals representative of the number of sequential echo clocks; and a burst length signal generator circuit receiving the counting signals and the burst length count, and outputting the burst end signal when the number of sequential echo clocks corresponds to the burst length count. The latch circuit comprises: a first logic gate and a second logic gate, wherein an output of the first logic gate is coupled to a first input of the second logic gate, and an output of the second logic gate is coupled to a first input of the first logic gate; and wherein a second input of the first logic gate receives the buffered data clock signal and a second input of the second logic gate receives the burst end signal. The echo pulse generator comprises: a first inverting delayer circuit for receiving the buffered data clock signal, and producing an output signal by inverting and delaying the received signal; a first AND gate receiving the buffered data clock signal and the output signal of the first inverting delayer circuit, and producing an output signal; a first NOR gate receiving the buffered data clock signal and the output signal of the first inverting delayer circuit, and producing an output signal; a first OR gate receiving the output of the first AND gate and the output of the first NOR gate, and producing an output signal; and a second AND gate receiving the pulse enable signal and the output signal of the first OR gate, and generating the number of sequential echo clocks corresponding to the burst length count. The reset circuit comprises: a second inverting circuit receiving the pulse enable signal and producing an output signal; a second NOR gate receiving the output signal of the second inverting delayer circuit and the pulse enable signal, and producing an output signal; and a second OR gate receiving the output signal of the second NOR gate and a power-up signal, and producing the reset signal.

The semiconductor memory device input circuit may also comprise: data input buffer means receiving input data and outputting buffered input data; echo clock generator means receiving a burst length count and a data clock at a frequency, and sequentially generating a number, corresponding to the burst length count, of echo clocks at twice the frequency; and input data transmission means receiving the buffered input data and the echo clock and generating clocked input data synchronously with the echo clock. The echo clock generator means comprises: means for buffering the data clock and generating a buffered data clock signal; means for counting the number of sequential echo clocks; and means, coupled to the means for buffering and the means for counting, for generating the number of sequential echo clocks corresponding to the burst length count. The means for buffering the data clock comprises: means for detecting the voltage of the data clock based on a lower reference voltage, and producing a first output signal; means for detecting the voltage of the data clock based on an upper reference voltage which is higher than the lower reference voltage, and producing a second output signal; and means, coupled to the first and second output signals, for generating the buffered data clock signal, wherein the buffered data clock signal is transited when the voltage of the data clock decreases to below the lower reference voltage or increases to above the upper reference voltage. The means for counting comprises: counting signal generator means for counting the echo clock and generating a plurality of counting signals representative of the number of sequential echo clocks; and means responsive to the counting signals for generating a burst end signal when the number of sequential echo clocks corresponds to the burst length count, wherein the means for generating the number of sequential echo clocks is responsive to the burst end signal.

The invention also encompasses a computer system comprising: a processing unit that generates a data clock and input data to be written to a semiconductor memory device, and generates a burst length count, wherein the processing unit is coupled to the semiconductor memory device; the semiconductor memory device having an input circuit comprising: a data input buffer receiving input data and outputting buffered input data; an echo clock generator receiving a data clock at a frequency and sequentially generating an echo clock at twice the frequency; and an input data transmission circuit receiving the buffered input data and the echo clock and generating clocked input data synchronously with the echo clock.

The invention encompasses a computer system comprising: a processing unit that generates a data clock and input data to be written to a semiconductor memory device, and generates a burst length count, wherein the processing unit is coupled to the semiconductor memory device; the semiconductor memory device having an input circuit comprising: data input buffer means receiving input data and outputting buffered input data; echo clock generator means receiving a burst length count and a data clock at a frequency, and sequentially generating a number, corresponding to the burst length count, of echo clocks at twice the frequency; and input data transmission means receiving the buffered input data and the echo clock and generating clocked input data synchronously with the echo clock.

The invention also encompasses a computer system comprising: a processing unit that generates a data clock and input data to be written to a semiconductor memory device, and generates a burst length count, wherein the processing unit is coupled to the semiconductor memory device; the semiconductor memory device having an input circuit comprising: data input buffer means receiving input data and outputting buffered input data; echo clock generator means receiving a data clock at a frequency and sequentially generating an echo clock at twice the frequency; and input data transmission means receiving the buffered input data and the echo clock and generating clocked input data synchronously with the echo clock.

BRIEF DESCRIPTION OF THE DRAWINGS

The above objects and advantages of the present invention will become more apparent by describing in detail a preferred embodiment thereof by reference to the attached drawings in which:

FIG. 5A is a waveform diagram of the operation of the echo clock generator 303 shown in FIG. 5.

DESCRIPTION OF THE PREFERRED EMBODIMENTS

Figure 1:
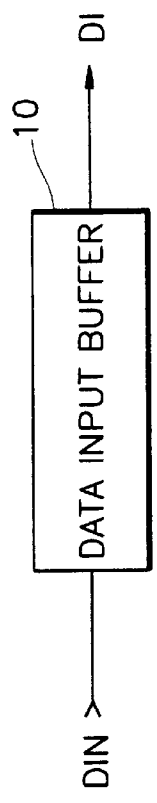
FIG. 1 is a block diagram of a conventional data input circuit.
Figure 2:
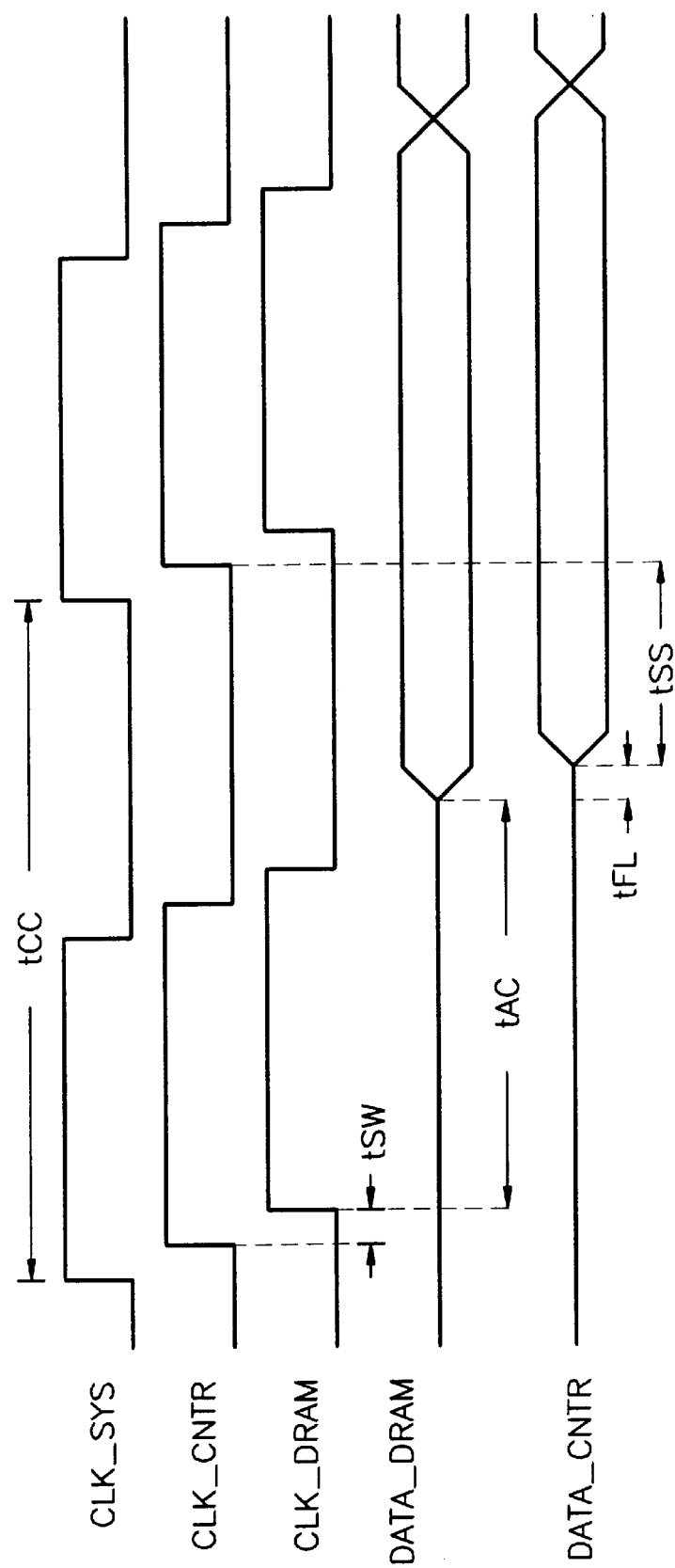
FIG. 2 is a waveform diagram showing various times that affect the clock cycle time $t_{CC}$ in a conventional data input circuit.

A preferred embodiment of the present invention will be described by reference to the appended drawings in which the same reference numerals in the drawings represent the same element throughout the drawings.

Figure 3:
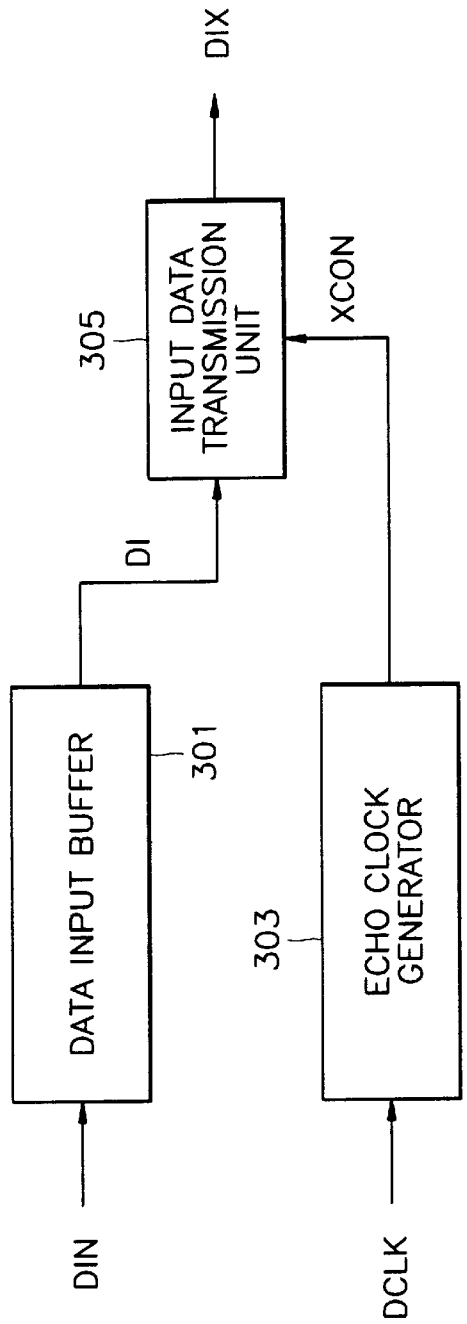
FIG. 3 is a block diagram of an embodiment of a data input circuit including an echo clock generator according to the present invention.

In FIG. 3 shows a data input circuit having an echo clock generator according to the present invention. The data input circuit includes a data input buffer 301, an echo clock generator 303, and an input data transmission unit 305. The data input buffer 301 buffers external input data DIN and provides buffered input data DI. The echo clock generator 303 generates a pulse XCON in response to the transition of an external data clock DCLK until the number of the external data clock signals reach a predetermined number. The input data transmission unit 305 transmits an output signal DIX in response to the output signal XCON of the echo clock generator 303. Typically, the input signals DIN and DCLK are synchronized to each other. The data input buffer 301 and echo clock generator 303 may be located in the memory controller or in the memory chip. The signal XCON is output at twice the frequency of the external data clock DCLK. The data DIN and the external data clock DCLK are sent or controlled by the central processing unit, which also controls the amount of data written to memory in a single block.

Figure 4:
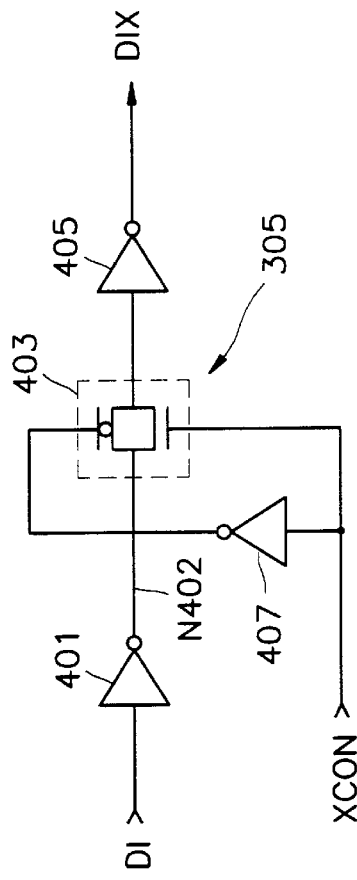
FIG. 4 is a schematic showing an embodiment of the input data transmission unit 305 of FIG. 3.

FIG. 4 shows an example of the input data transmission unit 305 of FIG. 3. Referring to FIG. 4, the input data transmission unit 305 includes a first inverting buffer 401, a transmission gate 403, and a second inverting buffer 405. The signal XCON from the echo clock generator 303 is input to one control input of the transmission gate 403, and a signal XCON which is inverted via a third inverting buffer 407 is input to the other control input thereof, so that an output signal N402 of the first inverting buffer 401 is transmitted by the transmission gate 403 in response to the signal XCON. The output of the transmission gate 403 is buffered by the second inverting buffer 405 to generate the output signal DIX.

Thus, when the transition of the external data clock DLCK occurs, the echo clock generator 302 generates a pulse XCON. Accordingly, the transmission gate 403 of the input data transmission unit 305 is turned on, so that an output signal DI of the data input buffer 301 is transmitted to the memory chip as clocked input data DIX. The echo clock generator 303 continues to generate XCON pulses until the number of external data clock signals DCLK reaches a predetermined number corresponding to the preset burst length of the data.

Figure 5:
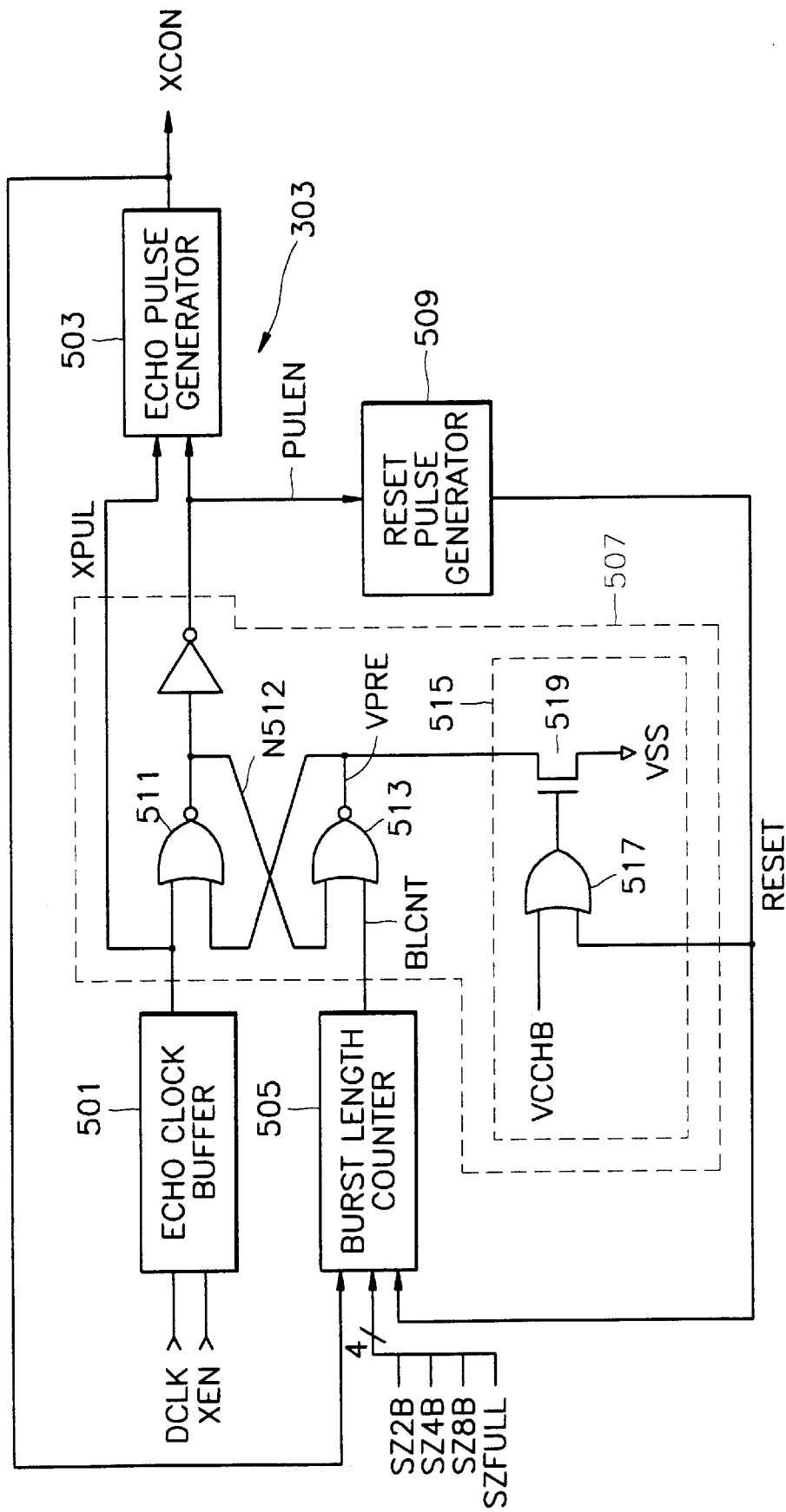
FIG. 5 is a schematic showing an embodiment of the echo clock generator 303 of FIG. 3.

FIG. 5 shows an embodiment of the echo clock generator of the data input circuit according to the present invention, and FIG. 5A is a waveform diagram showing the operation of the circuit. Referring to FIG. 5, the echo clock generator includes an echo clock buffer 501, an echo pulse generator 503, a burst length counter 505, a latch 507, and a reset pulse generator 509. The echo clock buffer 501 is further described in FIG. 6, the echo pulse generator 503 is further described in FIG. 7, the burst length counter 505 is further described in FIGS. 10–14, and the reset pulse generator 509 is further described in FIG. 9.

The echo clock buffer 501 outputs a buffered data clock signal XPUL by buffering an external data clock signal DCLK. The echo pulse generator 503 is enabled by a pulse enable signal PULEN, and it generates an output signal XCON as a pulse in response to the transition of the output signal XPUL of the echo clock buffer 501. The burst length counter 505 is preset by a reset pulse RESET, and a burst end signal BLCNT is generated when the number of pulses of the output signal XCON of the echo pulse generator 503 reaches a predetermined number. The predetermined number in the burst length counter 505 is set in accordance with states of inputs SZ2B, SZ4B, SZ8B, and SZFFULL. The SZ inputs are may be controlled by the memory control circuitry associated with the central processing unit.

The latch 507 generates the pulse enable signal PULEN which is preset by the reset pulse RESET, latched by the first transition of the output signal XPUL, and released from the latch by the transition of the output signal BLCNT. The structure of the latch 507 will now be described in detail. The latch 507 includes a first NOR gate 511 and a second NOR gate 513. The first NOR gate 511 receives an output signal VRPRE of the second NOR gate 315 and a signal XPUL produced in response to the signal DCLK. The second NOR gate 513 receives the output signal BLCNT from the burst length counter 505 and an output signal N512 from the first NOR gate 513.

The operation of the echo clock generator 303 is best described by reference to the schematic diagram in FIG. 5 and timing diagram in FIG. 5A. In the initial operation of the latch 507, the output signal BLCNT is in a "low" state. When the output signal XPUL transitions to a "high" state, the output signal N512 of the first NOR gate 511 goes "low," and PULEN is latched "high." This causes the output signal VPRE of the second NOR gate 513 to be latched to a "high" state. Then, even though the output signal XPUL of the echo clock buffer 501 may transition continuously, the output signal PULEN remains latched high. The echo pulse generator 503 generates XCON pulses in response to transitions of signal XPUL. After the echo pulse generator 503 generates a predetermined number of pulses XCON corresponding to the length of the data burst preset in the burst length counter 505, the output signal BLCNT from the burst length counter 505 transition to a "high" state. When BLCNT transitions high, then the output signal PULEN of the latch 507 goes "low," there by disabling the echo pulse generator 503 and preventing it from generating more XCON pulses.

The reset pulse generator 509 generates the reset pulse RESET in response to the transition of the pulse enable signal PULEN. The latch 507 includes a latch release portion 515. The latch release portion 515 resets the latch 507 at "power-up" (via VCCHB) or when the reset pulse RESET is generated.

Figure 6:
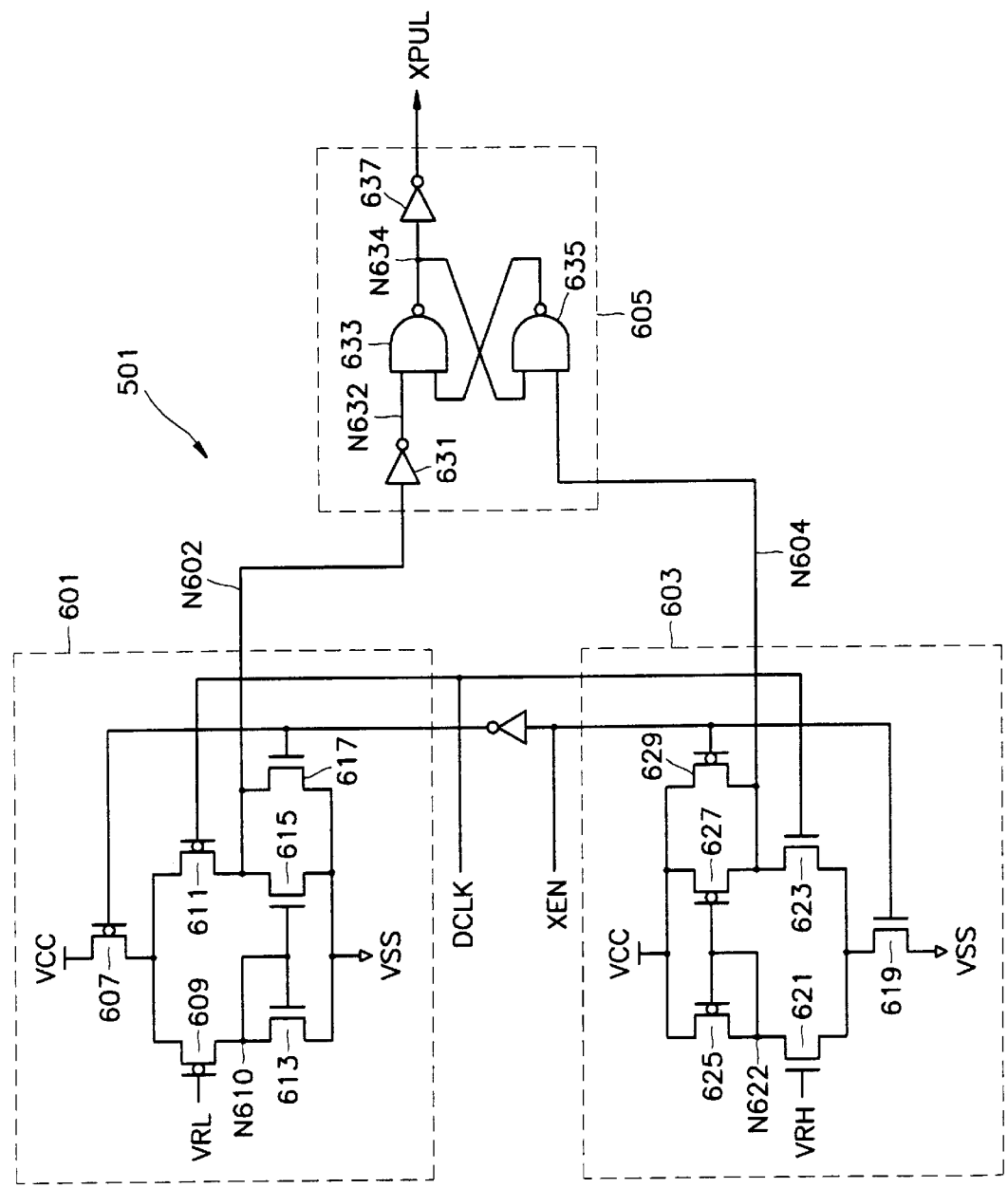
FIG. 6 is a schematic showing an embodiment of the echo clock buffer 501 of FIG. 5.

FIG. 6 shows an embodiment of the echo clock buffer 501 of FIG. 5. Referring to FIG. 6, the echo clock buffer 501 includes a lower current mirror 601, an upper current mirror 603, and latch 605. The lower current mirror 601 buffers the voltage of the data clock DCLK based on a predetermined lower reference voltage VRL. The upper current mirror 603 buffers the voltage of the data clock DCLK based on a predetermined upper reference voltage VRH which is higher than the lower reference voltage VRL. The latch 605 receives an output signal N602 from the lower current mirror 601 as a first input signal and an output signal N604 from the upper current mirror 603 as a second input signal to generate the output signal XPUL, which transitions when the level of the data clock signal DCLK decreases below a lower reference voltage VRL or increases above an upper reference voltage VRH. For a terminated interface that relies on a Vref reference voltage, VRL is typically Vref−0.1 V, and VRH is typically Vref+0.1 V, although other voltages may be used.

The lower current mirror 601 includes a pull-up transistor 607, a first PMOS transistor 609, a second PMOS transistor 611, a first NMOS transistor 613, a second NMOS transistor 615 and a third NMOS transistor 617. The pull-up transistor 607 has a source connected to a power voltage VCC and is turned on when an echo clock enable signal XEN is activated, that is, when the gate signal of the pull-up transistor 607 is input as a "low" signal. The first PMOS transistor 609 has a source connected to a drain of the pull-up transistor 607 and a gate to which the lower reference voltage VRL is applied. Also, the second PMOS transistor 611 has a source connected to the drain of the pull-up transistor 607 and a gate to which the data clock signal DCLK is applied. The first NMOS transistor 613 has a source connected to a ground voltage VSS, and a common connect point N610 to which a gate and a drain of the first NMOS transistor 613 are commonly connected to the drain of the first PMOS transistor 609. Also, the second NMOS transistor 615 has a source connected to the ground voltage VSS, a gate connected to the common connect point N610, and a drain connected to a drain of the second PMOS transistor 611, to generate the output signal N602 of the lower current mirror 601. The third NMOS transistor 617 has a source connected to the ground voltage VSS and a drain connected to the output port N602 of the lower current mirror 601, and it is turned on when the echo clock enable signal XEN is disabled, thereby pulling N602 to ground.

Thus, when the signal XEN is enabled to "high," the lower current mirror 601 responds to the data clock signal DCLK. When the level of the data clock signal DCLK is higher than that of the lower reference voltage VRL, a voltage Vgs between the gate and the source of the first PMOS transistor 609 is higher than that of the second PMOS transistor 611. Thus, the voltage of the common connect point N610 increases, so that the effect of the second NMOS transistor 615 becomes stronger than that of the second PMOS transistor 611. Thus, the voltage of the output port N602 of the lower current mirror 601 decreases toward the voltage VSS.

In contrast, when the level of the data clock signal DCLK is lower than that of the lower reference voltage VRL, the voltage Vgs of the first PMOS transistor 609 is lower than that of the second PMOS transistor 611. Thus, the voltage of the common connect point N610 decreases, so that the effect of the second NMOS transistor 615 becomes weaker than that of the second PMOS transistor 611. Thus, the voltage of the output port N602 of the lower current mirror 601 increases toward the voltage VCC.

The upper current mirror 603 includes a pull-down transistor 619, a third PMOS transistor 625, a fourth PMOS transistor 627, a fifth PMOS transistor 629, a fourth NMOS transistor 621, and a fifth NMOS transistor 623. The pull-down transistor 619 has a source connected to the ground voltage VSS and is turned on when the echo clock enable signal XEN is activated. The fourth NMOS transistor 621 has a source connected to a drain of the pull-down transistor 619 and a gate to which the upper reference voltage VRH is applied. The fifth NMOS transistor 623 has a source connected to the drain of the pull-down transistor 619 and a gate to which the data clock signal DCLK is applied. The third PMOS transistor 625 has a source connected to the power voltage VCC, a gate and a drain connected to a common connect point N622 and to a drain of the fourth NMOS transistor 621. The fourth PMOS transistor 627 has a source connected to the power voltage VCC, a gate connected to the common connect point N622, and a drain connected to a drain of the fifth NMOS transistor 623, to generate an output signal N604 of the upper current mirror 603. A fifth PMOS transistor 629 has a source connected to the power voltage VCC and a drain connected to the output port N604 of the upper current mirror 603, and it is turned on when the echo clock enable signal XEN is disabled, thereby pulling port N604 high.

Thus, when the signal XEN is enabled to "high," the upper current mirror 603 responds to the data clock signal DCLK. When the level of the data clock signal DCLK is lower than that of the upper reference voltage VRH, a voltage Vgs of the fourth NMOS transistor 621 is higher than that of the fifth NMOS transistor 623. Thus, the voltage of the common connect point N622 decreases, so that the effect of the fourth PMOS transistor 627 becomes stronger than that of the fifth NMOS transistor 623. Thus, the voltage at the output port N604 of the upper current mirror 603 increases toward the voltage VCC.

In contrast, when the level of the data clock signal DCLK is higher than that of the upper reference voltage VRH, voltage Vgs of the fourth NMOS transistor 621 is lower than that of the fifth NMOS transistor 623. Thus, the voltage of the common connect point N622 increases, so that the effect of the fourth PMOS transistor 627 becomes weaker than that of the fifth NMOS transistor 623. Thus, the voltage at the output portion N604 of the upper current mirror 603 decreases toward the voltage VSS.

The latch 605 includes an inverter 631, a first NAND gate 633, a second NAND gate 635 and an inverting buffer 637. The first NAND gate 633 receives an output signal N632 from the inverter 631 as a first input signal. The second NAND gate 635 performs a NAND operation on the output signal N604 of the upper current mirror 603 and an output signal N634 of the first NAND gate 633, and it generates an output signal N636 that is input to the first NAND gate 633 as a second input signal. The inverting buffer 637 inverts the output signal of the first NAND gate 633 and generates the output signal XPUL.

The echo clock buffer 501 in FIG. 6 operates as follows, when the signal XEN is enabled to a high level. When the level of the data clock signal DCLK is lower than that of the lower reference voltage VRL, the level of the output signal N602 of the lower current mirror 601 increases. This causes the level of the output N632 of the inverter 631 to go "low," so that the output signal XPUL of the echo clock buffer 501 decreases to a "low" level. At the same time, the level of the output signal N604 of the upper current mirror 603 goes "high," so that the level of the output N636 of the second NAND gate 635 goes "low." When the level of the data clock signal DCLK increases from a level that is lower than the lower reference voltage VRL to a level between the lower reference voltage VRL and the upper reference voltage VRH, the level of the output N602 of the lower current mirror 601 decreases. This causes the level of the output N632 of the inverter 631 to go "high." However, since the logic state of the output signal N636 of the second NAND gate 635 is maintained at a "low" level, the level of the output signal XPUL of the echo clock buffer 501 does not change.

When the level of the data clock signal DCLK is higher than the upper reference voltage VRH, the level of the output N602 of the lower current mirror 601 decreases. This causes the level of the output N632 of the inverter 631 to go "high." At the same time, the level of the output N604 of the upper current mirror 603 to go "low," so that the logic state of the output signal N636 of the second NAND gate 635 goes "high." This causes the level of the output signal XPUL to increase to a "high" level. When the level of the data clock signal DCLK decreases from a level that is higher than the upper reference voltage VRH to a level between the lower reference voltage VRL and the upper reference voltage VRH, the level of the output N604 of the upper current mirror 603 increases. However, since the logic state of the output signal N634 of the first NAND gate 633 is maintained at "low," the logic state of the output N636 of the second NAND gate 635 is maintained at "high." Thus, the level of the output signal XPUL of the echo clock buffer 501 does not change.

Figure 7:
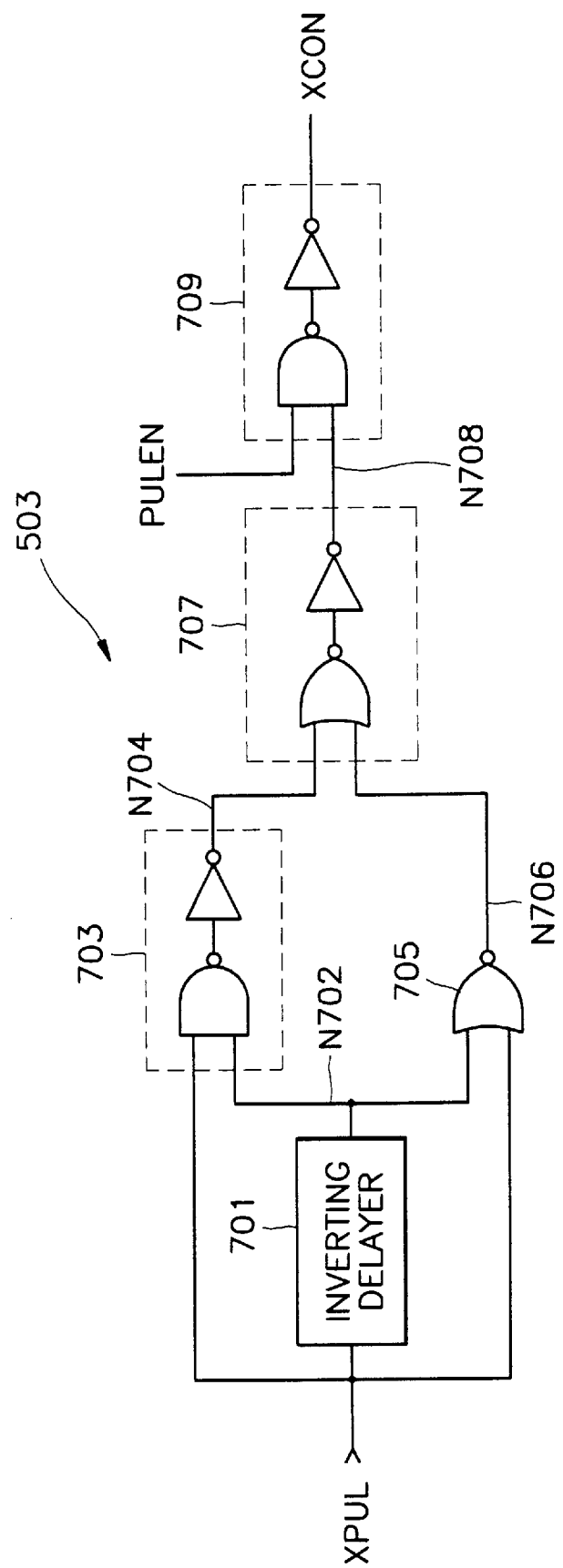
FIG. 7 is a schematic showing an embodiment of the echo pulse generator 503 of FIG. 5.

FIG. 7 is a diagram showing the echo pulse generator 503 of FIG. 5. Referring to FIG. 7, the echo pulse generator 503 includes an inverting delayer 701, a first AND gate 703, a NOR gate 705, an OR gate 707, and a second AND gate 709. The inverting delayer 701 inverts the output signal XPUL received from the echo clock buffer 501 and then delays the inverted result. The inverting delayer 701 maybe comprised of an odd number of inverters arranged in series. The first AND gate 703 performs an AND operation on the signal XPUL and an output signal N702 of the inverting delayer 701. The NOR gate 705 performs a NOR operation on the signal XPUL and the output signal N702 of the inverting delayer 701. The OR gate receives signal N704 and signal N706, and it generates output signal N708. The second AND gate 709 is enabled by the pulse enable signal PULEN and it generates the signal XCON in response to signal N708 from the OR gate 707.

Figure 8:
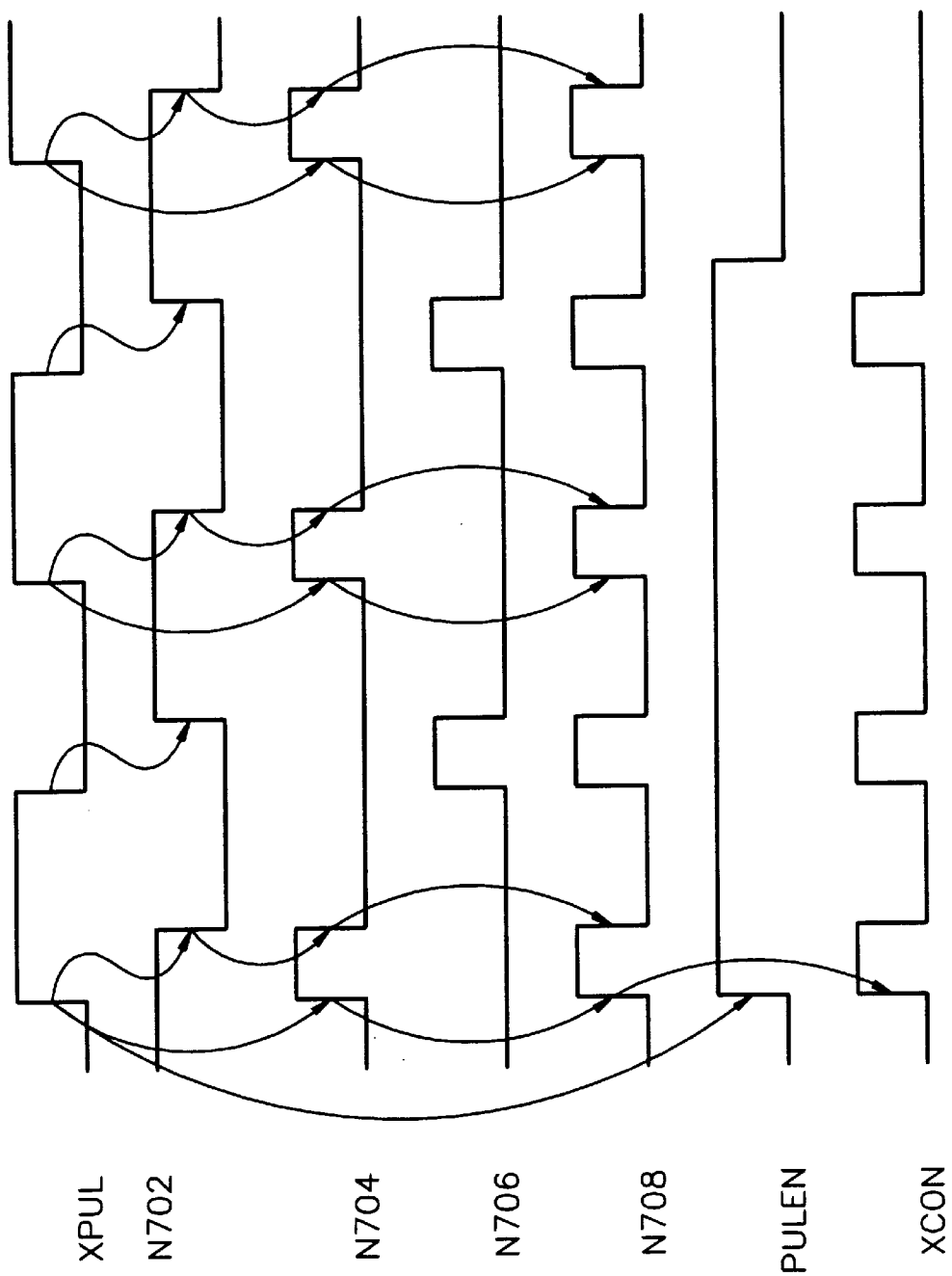
FIG. 8 is a timing diagram of the operation of the echo pulse generator in FIG. 7.

FIG. 8 is a timing diagram of the signals in the echo pulse generator 503 in FIG. 7 according to the transition of the signal XPUL. According to the operation of the echo pulse generator described in FIG. 7 and FIG. 8, whenever the logic state of the signal XPUL transitions from "high" to "low" or from "low" to "high," the signal N708 is generated as a pulse. Also, when the logic state of the pulse enable signal PULEN is high, the output signal XCON of the echo pulse generator is also generated as a pulse in response to the transition of the output signal N708 of the OR gate 707. However, when the logic state of the pulse enable signal PULEN is "low," the echo pulse generator does not generate a pulse XCON.

Figure 9:
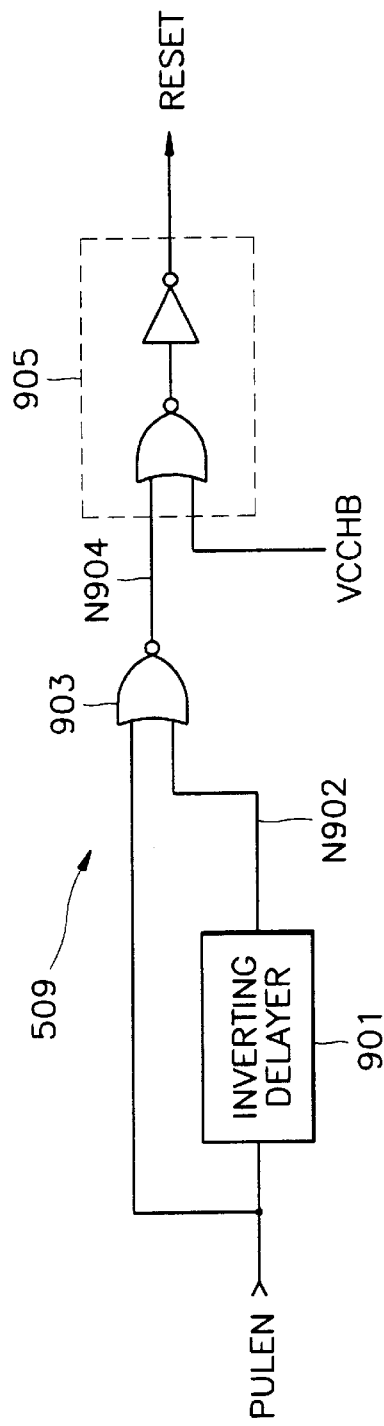
FIG. 9 is a schematic showing an example of the reset pulse generator 509 of FIG. 5.

FIG. 9 is a diagram showing an example of the reset pulse generator 509 of FIG. 5. The reset pulse generator 509 generates a reset pulse RESET when the signal PULEN changes from "high" to "low." Referring to FIG. 9, the reset pulse generator 509 includes an inverting delayer 901, a NOR gate 903 and an OR gate 905. The inverting delayer 901 inverts and delays the pulse enable signal PULEN. The NOR gate 903 receives the pulse enable signal PULEN and the output signal N902 of the inverting delayer 901. Thus, whenever the logic state of the pulse enable signal PULEN transitions from "high" to "low," the output signal N904 of the first NOR gate 903 transitions from "low" to "high." The OR gate 905 receives the signal N904 and a power-up signal VCCHB as a high pulse during power-up. Thus, during power-up or when the logic state of the pulse enable signal PULEN transitions from "high" to "low," the OR gate 905 generates the reset signal RESET as a high-going pulse.

Figure 10:
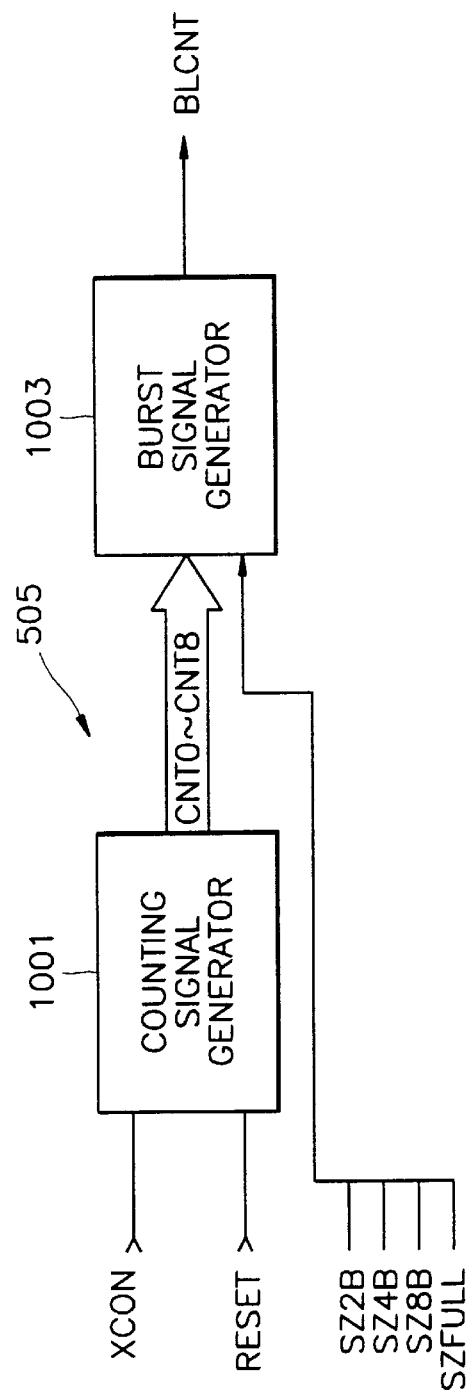
FIG. 10 is a block diagram showing an embodiment of the burst length counter 505 of FIG. 5.

FIG. 10 is a diagram showing an example of the burst length counter 505 of FIG. 5. Referring to FIG. 10, the burst length counter 505 includes a counting signal generator 1001 and a burst signal generator 1003. The counting signal generator 1001 counts the number of pulses of the output signal XCON of the echo pulse generator 503 to generate counting signal groups CNT0 through CNT8. The burst signal generator 1003 receives the counting signal groups to generate a signal BLCNT corresponding to the burst length. The burst signal generator 1003 also receives signals representing the predetermined burst length: SZ2B, SZ4B, SZ8B, and SZFULL. The burst length counter 505 counts XCON pulses until they reach the predetermined number set by SZ2B to SZFULL, at which time the burst length counter 505 generates the signal BLCNT.

Figure 11:
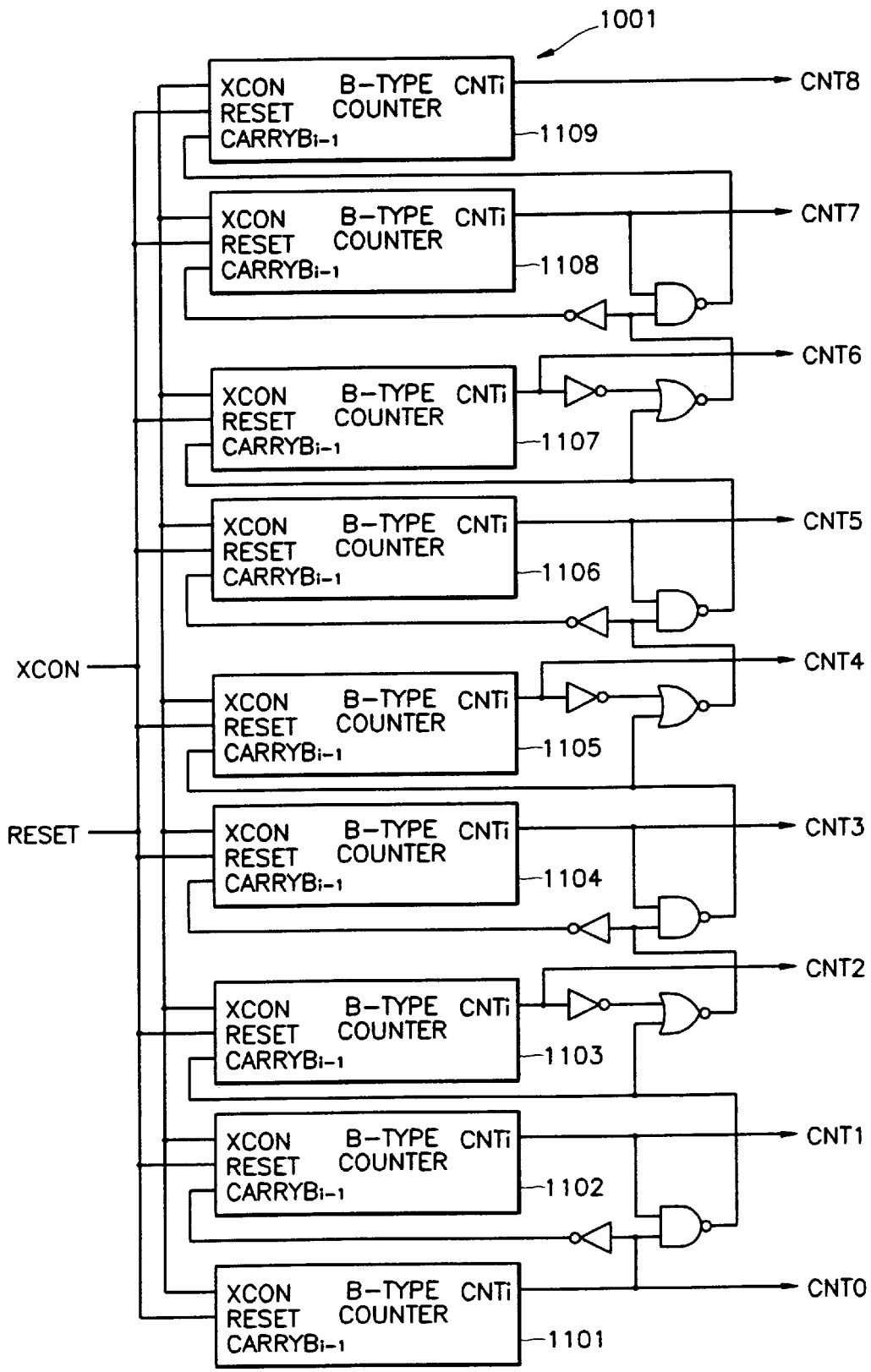
FIG. 11 is a schematic showing an embodiment of the counting signal generator 1001 of FIG. 10.
Figure 12:
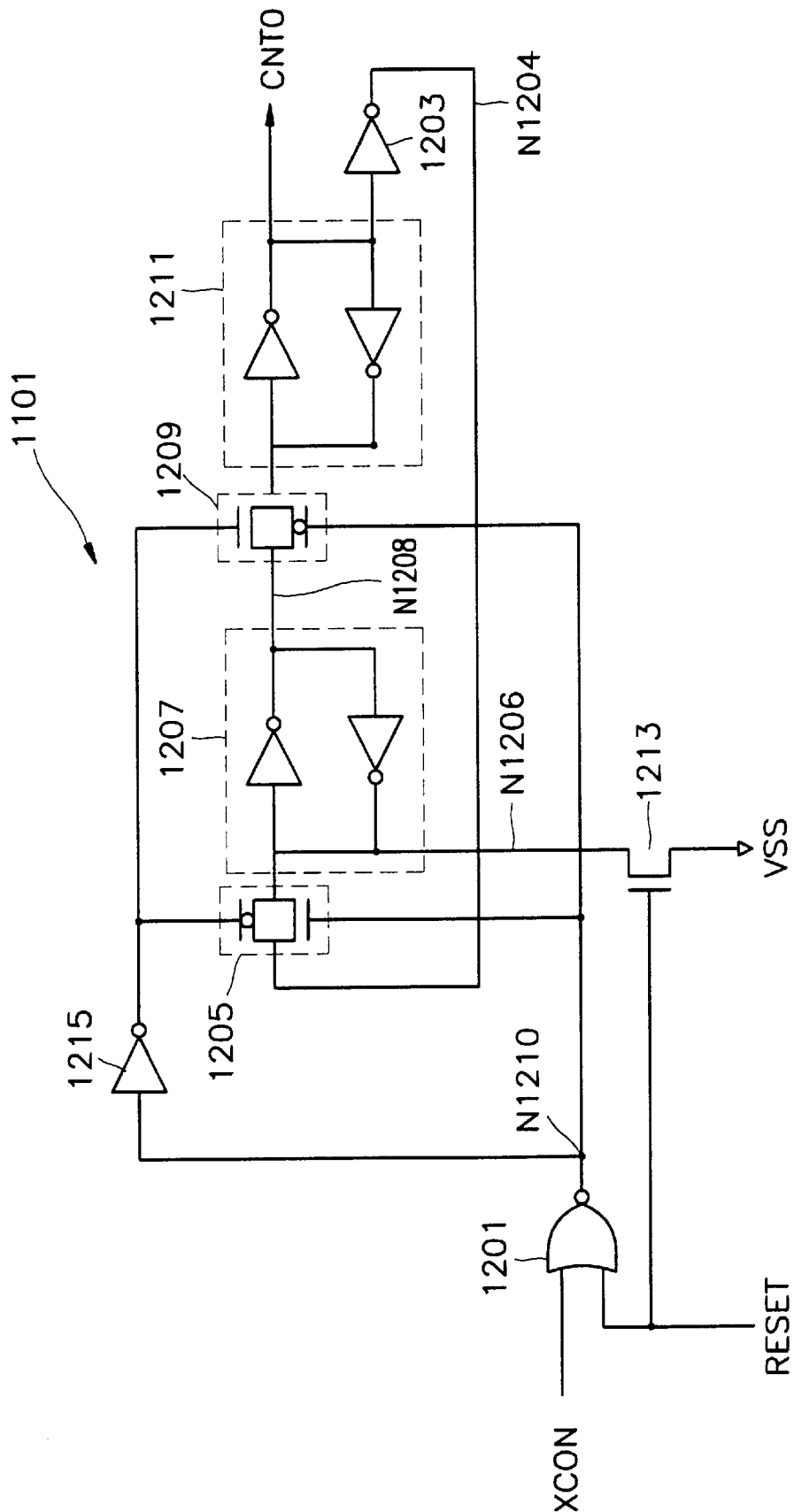
FIG. 12 is a schematic showing an embodiment of the A-type counter 1101 of FIG. 11.
Figure 13:
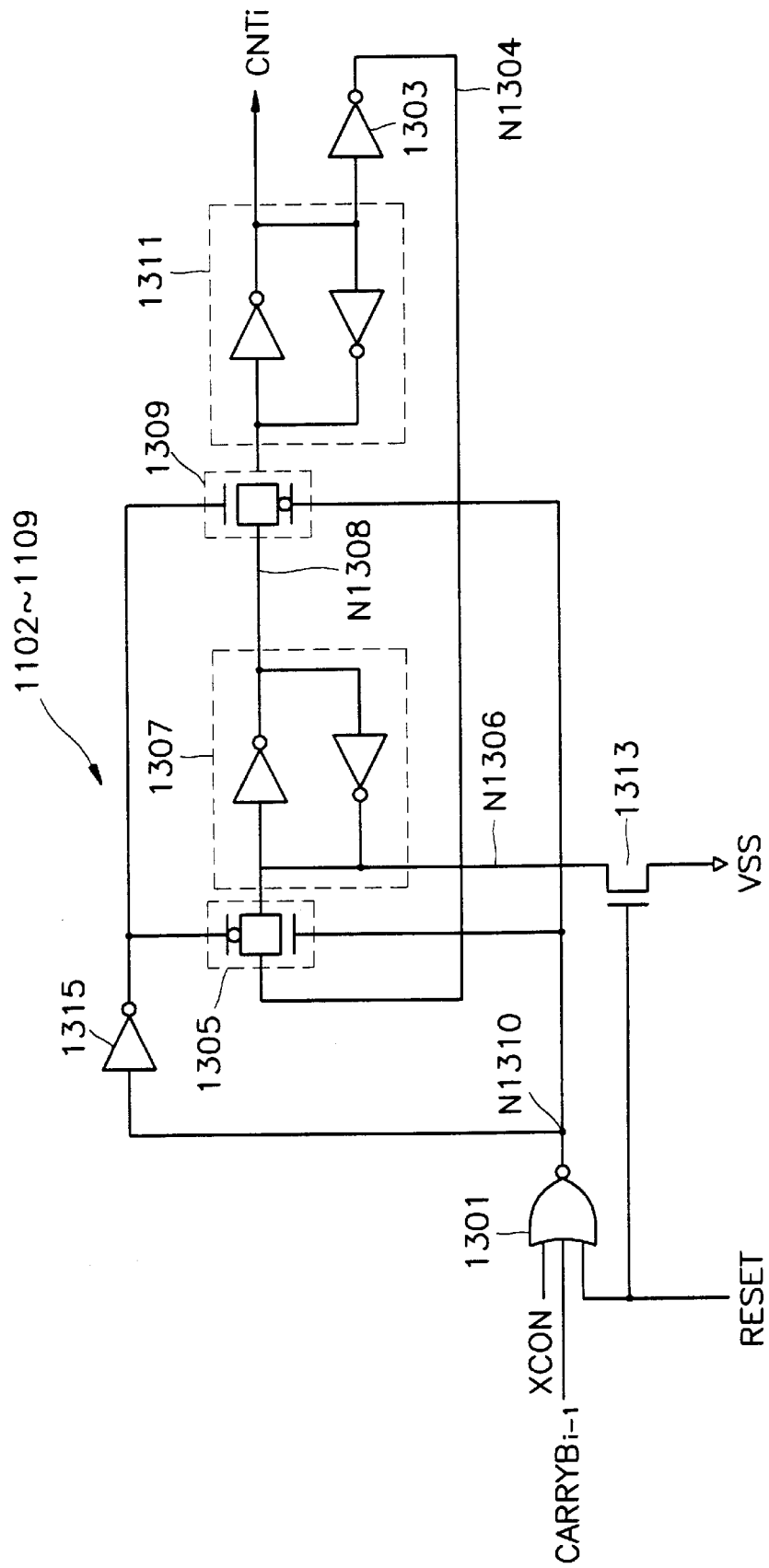
FIG. 13 is a schematic showing an embodiment of the B-type counters 1102 to 1109 of FIG. 11.

FIG. 11 is a diagram showing an embodiment of the counting signal generator 1001 of FIG. 10. Referring to FIG. 11, the counting signal generator 1001 includes an A-type counter 1101 and a plurality of B-type counters 1102 through 1109. The A-type counter 1101 is shown in FIG. 12, and the B-type counter is shown in FIG. 13. The operation of the A-type and B-type counters in FIGS. 12–13 will be discussed first, prior to describing the operation of the counting signal generator 1001 in FIG. 11.

FIG. 12 is a diagram showing an example of the A-type counter 1101 of FIG. 11. Referring to FIG. 12, the A-type counter 1101 includes a NOR gate 1201, first and second inverters 1203 and 1215, a first transmission gate 1205, a first latch 1207, a second transmission gate 1209, a second latch 1211, and an NMOS transistor 1213.

The NOR gate 1201 performs an OR operation on the reset pulse RESET and the signal XCON, and inverts the OR-operated result to produce signal N1210. The first inverter 1203 inverts the logic state of the output signal CNT0 of the A-type counter 1101. The first transmission gate 1205 transmits signal N1 204 to its output when signal N1210 is in a "high" state. The first latch 1207 latches the signal transmitted by the first transmission gate 1205, and the second transmission gate 1209 transmits signal N1208 from the first latch 1207 when signal N1210 is in a "high" state. The second latch 1211 latches the signal transmitted by the second transmission gate 1207. Latch 1207 is initialized when NMOS transistor 1213 having a source connected to the ground voltage VSS is gated by the reset pulse RESET, thereby presetting the input of the first latch 1207 to ground.

The A-type counter 1101 operated as follows. First, when the reset pulse RESET is activated to "high," the NMOS transistor 1213 is turned on so that the input N1206 of the first latch 1207 is precharged to the voltage VSS, thereby setting the signal N1208 "high" at the output of the first latch 1207. At that time, the second transmission gate 1209 is turned on to set the input of second latch 1211 "high," and the logic state of the output signal CNT0 of the A-type counter 1101 goes "low." This causes the signal N1204 from the first inverter 1203 to become high. When the reset pulse RESET is disabled to "low," the NMOS transistor 1213 is turned off and the first transmission gate 1205 is turned on, causing the output signal N1208 of the first latch 1207 to go "low." At this time, the second transmission gate 1209 is turned off.

When the signal XCON from the echo pulse generator 503 is activated to "high," the second transmission gate 1209 is turned on, and the logic state of the output signal CNT0 of the A-type counter 1101 transitions to "high." Also, when the signal XCON is disabled to "low," the first transmission gate 1209 is turned on, so that the signal N1208 transitions to "high." As above, whenever the output signal XCON of the echo pulse generator 503 generates a pulse, the A-type counter 1101 produces a change in the logic state of the output signal CNT0.

FIG. 13 is a diagram showing an embodiment of the B-type counters 1102 through 1109 of FIG. 11. Referring to FIG. 13, the B-type counters are very similar to the A-type counter, except that the B-type counters accept a "carry" input to the NOR gate 1301. Each NOR gate 1301 of the B-type counters 1102 through 1109 receives the reset pulse RESET, the output signal XCON from the echo pulse generator 503, and a carry signal $CARRYB_{i-1}$ representing the logic state of the output signal of the previous counters. As shown in FIG. 11, when the logic state of all output signals of the previous counters is "high," the logic state of the signal $CARRYB_{i-1}$ goes "low." Comparing FIGS. 12 and 13, it can be seen that when the logic state of the signal $CARRYB_{i-1}$ goes "low," the B-type counters operate like the A-type counter.

Referring to the A-type counter in FIG. 12 and the B-type counters in FIG. 13, the operation of the counting signal generator in FIG. 11 will now be described as follows. First, when a reset operation occurs by the reset pulse RESET, the output signals CNT0 through CNT8 of the A-type and B-type counters 1101 through 1109 are preset to 0. When the signal XCON generates a first pulse, the logic state of the output signal CNT0 goes to "1." When the signal XCON generates a second pulse, the logic state of the output signal CNT0 goes to "0," and that of the output signal CNT1 goes to "1." When the signal XCON generates a third pulse, the logic state of the output signal CNT0 goes to "1." When the signal XCON generates a fourth pulse, the logic state of the output signals CNT0 and CNT1 goes to "0," and the logic state of the output signal CNT2 goes to "1." As above, whenever the signal XCON generates a pulse, the output signals CNT0 through CNT8 of the counting signal generator 1001 sequentially change in a binary manner to count the number of pulses of the signal XCON. Finally, when the signal XCON generates pulses corresponding to a predetermined number, the reset signal RESET is activated, so that all output signals CNT0 through CNT8 are preset to "0."

Figure 14:
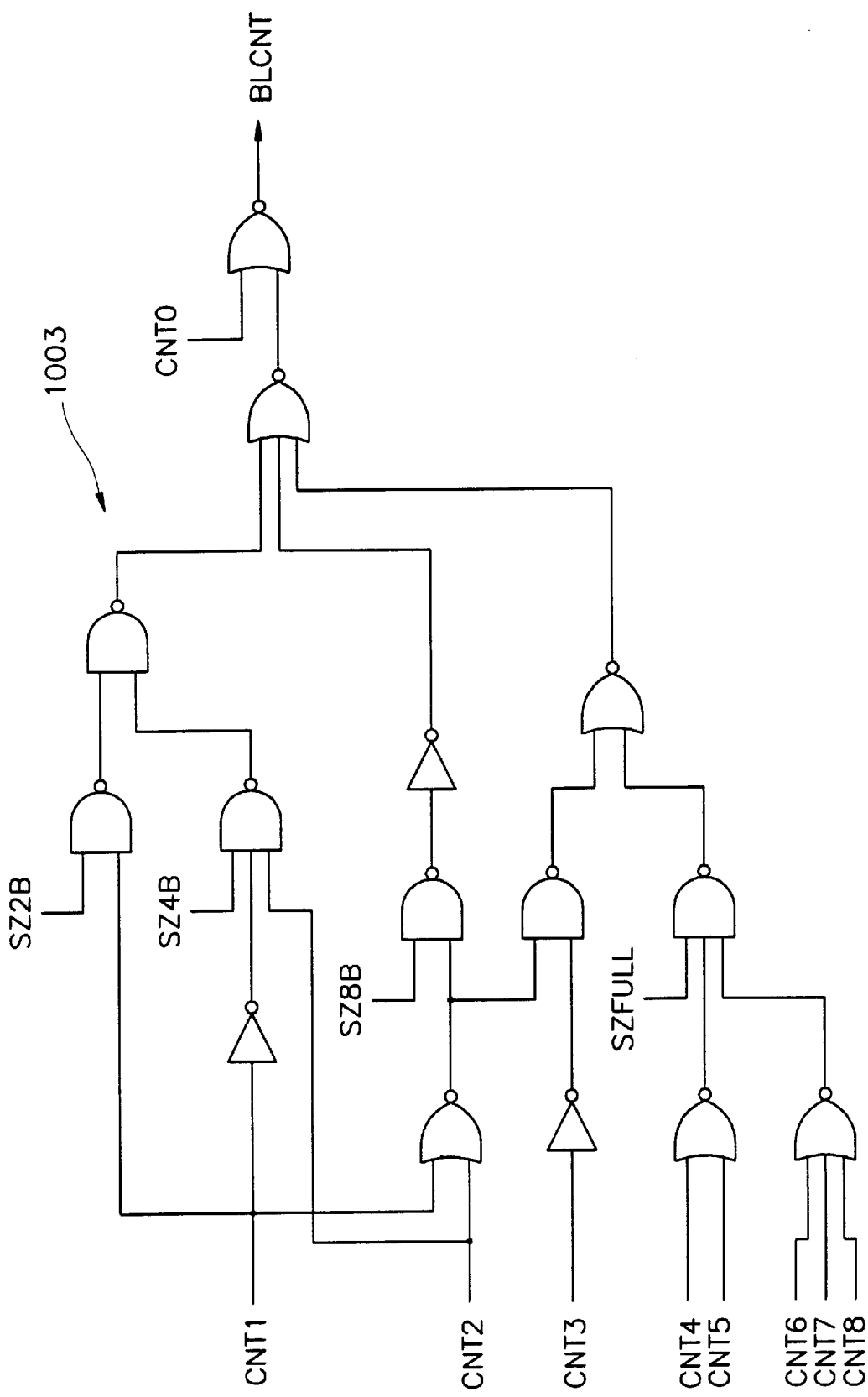
FIG. 14 is a schematic showing an embodiment of the burst signal generator 1003 of the burst length counter 505 of FIG. 10.

FIG. 14 is a diagram showing the burst signal generator 1003 of the burst length counter of FIG. 10. The burst signal generator 1003 generates the output signal BLCNT when the number of pulses of the output signal XCON generated from the echo pulse generator 503 reaches a predetermined number of input pulses, in response to the counting signal groups CNT0 through CNT8. The signals SZ2B, SZ4B, SZ8B, and SZFULL represent the burst length of data to be transmitted to the memory device. The signals may be preset by fuse circuits or may be controlled through a latch or mode set register. In FIG. 14, SZ2B represents a signal that is "high" when the burst length of the input data is 2 or greater, SZ4B represents a signal that is "high" when the burst length of the input data is 4 or greater, SZ8B represents a signal that is "high" when the burst length of the input data is 8 or greater, and SZFULL represents a signal that is "high" when the burst length of the input data corresponds to the maximum burst length.

For example, we will assume that the burst length of the input data is 4. Here, the signals SZ2B and SZ4B are "high," and the signals SZ8B and SZFULL are "low." During data transmission to the memory device, when the echo pulse generator 503 generates the fourth pulse of the signal XCON, the signal CNT2 goes "high" while the remaining counting signal groups CNT0, CNT1 and CNT3 through CNT8 become "low." At this time, the logic state of the output signal BLCNT transitions from "low" to "high," thereby signaling that the desired length of burst data has been transmitted to the memory device.

As described, in the data input circuit above, the echo clock generator 303 generates pulses in response to a predetermined length of a data burst. The pulses correspond to an echo clock that is transmitted in the memory devices simultaneously with the data. The data is stored in the internal memory cells of the memory device.

The present invention is not limited to the particular form illustrated, and further modifications and alterations will occur to those skilled in the art within the spirit and scope of the present invention. For example, many types of counters are well-known in the art, and they may be substituted for the type-A and type-B counters shown in the preferred embodiment. Also, the counters may operate by counting the data clock rather than the echo clock. In addition, different combinational logic or comparator circuitry may be substituted for the logic circuitry shown in FIG. 14. The counting circuitry may be altered to use a presettable counter that counts to zero rather than a counter that counts up to the burst length. Many similar alterations known to one of ordinary skill in the art may be performed within the scope of this invention.

Therefore, the data access time in a synchronous semiconductor memory device is improved by eliminating the effects of the time $t_{AC}$ required from the clock synchronization to the data output and the time $t_{FL}$ required for transmitting the data from the controller to the memory.

What is claimed is:

1. An input circuit for a semiconductor memory device comprising:

a data input buffer receiving input data and outputting buffered input data;

an echo clock generator receiving a data clock at a frequency and sequentially generating an echo clock at twice the frequency; and an input data transmission circuit receiving the buffered input data and the echo clock and generating clocked input data synchronously with the echo clock.

2. An input circuit as in claim 1, in which the echo clock generator further receives:

an enable signal for enabling the generation of the echo clock; and a burst length count for determining a number of echo clocks sequentially generated by the echo clock generator.

3. An input circuit as in claim 2, wherein the echo clock generator further comprises:

an echo clock buffer for generating a buffered data clock signal in response to the data clock and the enable signal;

a burst length counter, receiving the burst length count and the echo clock, for counting the number of sequential echo clocks and generating a burst end signal when the number of sequential echo clocks corresponds to the burst length count; and a burst clock generator, responsive to the buffered data clock signal and the burst end signal, for generating the number of sequential echo clocks corresponding to the burst length count.

4. An input circuit as in claim 3, wherein the burst clock generator comprises:

a latch circuit having inputs coupled to the buffered data clock signal and the burst end signal and an output that generates a pulse enable signal; and an echo pulse generator for generating the number of sequential echo clocks corresponding to the burst length count in response to the buffered data clock signal and the pulse enable signal.

5. An input circuit as in claim 3, wherein the echo clock generator further comprises:

a reset circuit for resetting the burst length counter when the number of sequential echo clocks corresponding to the burst length count has been generated.

6. An input circuit as in claim 3, wherein the echo clock buffer comprises:

a lower current mirror circuit for detecting the voltage of the data clock based on a lower reference voltage, and producing a first output signal;

an upper current mirror circuit for detecting the voltage of the data clock based on an upper reference voltage which is higher than the lower reference voltage, and producing a second output signal; and a buffer latch circuit coupled to the first and second output signals, for generating the buffered data clock signal, wherein the buffered data clock signal is transited when the voltage of the data clock decreases to below the lower reference voltage or increases to above the upper reference voltage.

7. An input circuit as in claim 3, wherein the burst length counter comprises:
   a counting signal generator circuit for counting the echo clock and generating a plurality of counting signals representative of the number of sequential echo clocks; and
   a burst length signal generator circuit receiving the counting signals and the burst length count, and outputting the burst end signal when the number of sequential echo clocks corresponds to the burst length count.

8. An input circuit as in claim 7, wherein the counting signal generator circuit comprises an A-type counter and a plurality of B-type counters coupled to synchronously count the number of sequential echo clocks.

9. An input circuit as in claim 8, wherein the burst signal generator circuit comprises combinational logic circuitry.

10. An input circuit as in claim 4, wherein the latch circuit comprises:
    a first logic gate and a second logic gate, wherein an output of the first logic gate is coupled to a first input of the second logic gate, and an output of the second logic gate is coupled to a first input of the first logic gate; and
    wherein a second input of the first logic gate receives the buffered data clock signal and a second input of the second logic gate receives the burst end signal.

11. An input circuit as in claim 4, wherein the echo pulse generator comprises:
    a first inverting delayer circuit for receiving the buffered data clock signal, and producing an output signal by inverting and delaying the received signal;
    a first AND gate receiving the buffered data clock signal and the output signal of the first inverting delayer circuit, and producing an output signal;
    a first NOR gate receiving the buffered data clock signal and the output signal of the first inverting delayer circuit, and producing an output signal;
    a first OR gate receiving the output of the first AND gate and the output of the first NOR gate, and producing an output signal; and
    a second AND gate receiving the pulse enable signal and the output signal of the first OR gate, and generating the number of sequential echo clocks corresponding to the burst length count.

12. An input circuit as in claim 5, wherein the reset circuit comprises:
    a second inverting circuit receiving the pulse enable signal and producing an output signal;
    a second NOR gate receiving the output signal of the second inverting delayer circuit and the pulse enable signal, and producing an output signal; and
    a second OR gate receiving the output signal of the second NOR gate and a power-up signal, and producing the reset signal.

13. An input circuit for a semiconductor memory device comprising:
    data input buffer means receiving input data and outputting buffered input data;
    echo clock generator means receiving a burst length count and a data clock at a frequency, and sequentially generating a number, corresponding to the burst length count, of echo clocks at twice the frequency; and
    input data transmission means receiving the buffered input data and the echo clock and generating clocked input data synchronously with the echo clock.

14. An input circuit as in claim 13, wherein the echo clock generator means comprises:
    means for buffering the data clock and generating a buffered data clock signal;
    means for counting the number of sequential echo clocks; and
    means, coupled to the means for buffering and the means for counting, for generating the number of sequential echo clocks corresponding to the burst length count.

15. An input circuit as in claim 14, wherein the means for buffering the data clock comprises:
    means for detecting the voltage of the data clock based on a lower reference voltage, and producing a first output signal;
    means for detecting the voltage of the data clock based on an upper reference voltage which is higher than the lower reference voltage, and producing a second output signal; and
    means, coupled to the first and second output signals, for generating the buffered data clock signal, wherein the buffered data clock signal is transited when the voltage of the data clock decreases to below the lower reference voltage or increases to above the upper reference voltage.

16. An input circuit as in claim 14, wherein the means for counting comprises:
    counting signal generator means for counting the echo clock and generating a plurality of counting signals representative of the number of sequential echo clocks; and
    means responsive to the counting signals for generating a burst end signal when the number of sequential echo clocks corresponds to the burst length count, wherein the means for generating the number of sequential echo clocks is responsive to the burst end signal.

17. An input circuit as in claim 15, wherein the means for counting comprises:
    counting signal generator means for counting the echo clock and generating a plurality of counting signals representative of the number of sequential echo clocks; and
    means responsive to the counting signals for generating a burst end signal when the number of sequential echo clocks corresponds to the burst length count, wherein the means for generating the number of sequential echo clocks is responsive to the burst end signal.

18. An input circuit for a semiconductor memory device comprising:
    data input buffer means receiving input data and outputting buffered input data;
    echo clock generator means receiving a data clock at a frequency and sequentially generating an echo clock at twice the frequency; and
    input data transmission means receiving the buffered input data and the echo clock and generating clocked input data synchronously with the echo clock.

19. An input circuit as in claim 18, in which the echo clock generator means receives:
    an enable signal for enabling the generation of the echo clock; and
    a burst length count for determining a number of echo clocks sequentially generated by the echo clock generator means.

20. An input circuit as in claim 19, wherein the echo clock generator means further comprises:
   echo clock buffer means generating a buffered data clock signal in response to the data clock and the enable signal;
   burst length counter means, receiving the burst length count and the echo clock, for counting the number of sequential echo clocks and generating a burst end signal when the number of sequential echo clocks corresponds to the burst length count; and
   burst clock generating means, responsive to the buffered data clock signal and the burst end signal, for generating the number of sequential echo clocks corresponding to the burst length count.

21. An input circuit as in claim 20, wherein the burst clock generating means comprises:
   latch means having inputs coupled to the buffered data clock signal and the burst end signal and an output that generates a pulse enable signal; and
   echo pulse generator means for generating the number of sequential echo clocks corresponding to the burst length count in response to the buffered data clock signal and the pulse enable signal.

22. An input circuit as in claim 20, wherein the echo clock generator means further comprises:
   reset means for resetting the burst length counter means when the number of sequential echo clocks corresponding to the burst length count has been generated.

23. An input circuit as in claim 20, wherein the echo clock buffer means comprises:
   lower current mirror means for detecting the voltage of the data clock based on a lower reference voltage, and producing a first output signal;
   upper current mirror means for detecting the voltage of the data clock based on an upper reference voltage which is higher than the lower reference voltage, and producing a second output signal; and
   buffer latch means coupled to the first and second output signals, for generating the buffered data clock signal, wherein the buffered data clock signal is transited when the voltage of the data clock decreases to below the lower reference voltage or increases to above the upper reference voltage.

24. An input circuit as in claim 20, wherein the burst length counter means comprises:
   counting signal generator means for counting the echo clock and generating a plurality of counting signals representative of the number of sequential echo clocks; and
   burst length signal generator means receiving the counting signals and the burst length count, and outputting the burst end signal when the number of sequential echo clocks corresponds to the burst length count.

25. An input circuit as in claim 24, wherein the counting signal generator means comprises an A-type counter means and a plurality of B-type counter means coupled to synchronously count the number of sequential echo clocks.

26. An input circuit as in claim 25, wherein the burst signal generator means comprises combinational logic circuitry.

27. An input circuit as in claim 21, wherein the latch means comprises:
   a first logic gate and a second logic gate, wherein an output of the first logic gate is coupled to a first input of the second logic gate, and an output of the second logic gate is coupled to a first input of the first logic gate; and
   wherein a second input of the first logic gate receives the buffered data clock signal and a second input of the second logic gate receives the burst end signal.

28. An input circuit as in claim 21, wherein the echo pulse generator means comprises:
   a first inverting delayer means for receiving the buffered data clock signal, and producing an output signal by inverting and delaying the received signal;
   a first AND gate receiving the buffered data clock signal and the output signal of the first inverting delayer means, and producing an output signal;
   a first NOR gate receiving the buffered data clock signal and the output signal of the first inverting delayer means, and producing an output signal;
   a first OR gate receiving the output of the first AND gate and the output of the first NOR gate, and producing an output signal; and
   a second AND gate receiving the pulse enable signal and the output signal of the first OR gate, and generating the number of sequential echo clocks corresponding to the burst length count.

29. An input circuit as in claim 22, wherein the reset means comprises:
   a second inverting delayer means receiving the pulse enable signal and producing an output signal;
   a second NOR gate receiving the output signal of the second inverting delayer means and the pulse enable signal, and producing an output signal; and
   a second OR gate receiving the output signal of the second NOR gate and a power-up signal, and producing the reset signal.

30. A computer system comprising:
   a processing unit that generates a data clock and input data to be written to a semiconductor memory device, and generates a burst length count, wherein the processing unit is coupled to the semiconductor memory device;
   the semiconductor memory device having an input circuit comprising:
      a data input buffer receiving input data and outputting buffered input data;
      an echo clock generator receiving a data clock at a frequency and sequentially generating an echo clock at twice the frequency; and
      an input data transmission circuit receiving the buffered input data and the echo clock and generating clocked input data synchronously with the echo clock.

31. A computer system as in claim 30, in which the echo clock generator further receives:
   an enable signal for enabling the generation of the echo clock; and
   a burst length count for determining a number of echo clocks sequentially generated by the echo clock generator.

32. A computer system as in claim 31, wherein the echo clock generator further comprises:
   an echo clock buffer for generating a buffered data clock signal in response to the data clock and the enable signal;
   a burst length counter, receiving the burst length count and the echo clock, for counting the number of sequential echo clocks and generating a burst end signal when the number of sequential echo clocks corresponds to the burst length count; and
   a burst clock generator, responsive to the buffered data clock signal and the burst end signal, for generating the number of sequential echo clocks corresponding to the burst length count.

33. A computer system as in claim 32, wherein the burst clock generator comprises:

a latch circuit having inputs coupled to the buffered data clock signal and the burst end signal and an output that generates a pulse enable signal; and an echo pulse generator for generating the number of sequential echo clocks corresponding to the burst length count in response to the buffered data clock signal and the pulse enable signal.

34. A computer system as in claim 32, wherein the echo clock generator further comprises:

a reset circuit for resetting the burst length counter when the number of sequential echo clocks corresponding to the burst length count has been generated.

35. A computer system as in claim 32, wherein the echo clock buffer comprises:

a lower current mirror circuit for detecting the voltage of the data clock based on a lower reference voltage, and producing a first output signal;

an upper current mirror circuit for detecting the voltage of the data clock based on an upper reference voltage which is higher than the lower reference voltage, and producing a second output signal; and a buffer latch circuit coupled to the first and second output signals, for generating the buffered data clock signal, wherein the buffered data clock signal is transited when the voltage of the data clock decreases to below the lower reference voltage or increases to above the upper reference voltage.

36. A computer system as in claim 32, wherein the processing unit is coupled to a plurality of the semiconductor memory devices.

37. A computer system comprising:

a processing unit that generates a data clock and input data to be written to a semiconductor memory device, and generates a burst length count, wherein the processing unit is coupled to the semiconductor memory device;

the semiconductor memory device having an input circuit comprising:

data input buffer means receiving input data and outputting buffered input data;

echo clock generator means receiving a burst length count and a data clock at a frequency, and sequentially generating a number, corresponding to the burst length count, of echo clocks at twice the frequency; and input data transmission means receiving the buffered input data and the echo clock and generating clocked input data synchronously with the echo clock.

38. A computer system as in claim 37, wherein the echo clock generator means comprises:

means for buffering the data clock and generating a buffered data clock signal;

means for counting the number of sequential echo clocks; and means, coupled to the means for buffering and the means for counting, for generating the number of sequential echo clocks corresponding to the burst length count.

39. A computer system as in claim 38, wherein the means for buffering the data clock comprises:

means for detecting the voltage of the data clock based on a lower reference voltage, and producing a first output signal;

means for detecting the voltage of the data clock based on an upper reference voltage which is higher than the lower reference voltage, and producing a second output signal; and means, coupled to the first and second output signals, for generating the buffered data clock signal, wherein the buffered data clock signal is transited when the voltage of the data clock decreases to below the lower reference voltage or increases to above the upper reference voltage.

40. A computer system as in claim 38, wherein the means for counting comprises:

counting signal generator means for counting the echo clock and generating a plurality of counting signals representative of the number of sequential echo clocks; and means responsive to the counting signals for generating a burst end signal when the number of sequential echo clocks corresponds to the burst length count, wherein the means for generating the number of sequential echo clocks is responsive to the burst end signal.

41. A computer system as in claim 39, wherein the means for counting comprises:

counting signal generator means for counting the echo clock and generating a plurality of counting signals representative of the number of sequential echo clocks; and means responsive to the counting signals for generating a burst end signal when the number of sequential echo clocks corresponds to the burst length count, wherein the means for generating the number of sequential echo clocks is responsive to the burst end signal.

42. A computer system as in claim 37, wherein the processing unit is coupled to a plurality of the semiconductor memory devices.

43. A computer system comprising:

a processing unit that generates a data clock and input data to be written to a semiconductor memory device, and generates a burst length count, wherein the processing unit is coupled to the semiconductor memory device;

the semiconductor memory device having an input circuit comprising:

data input buffer means receiving input data and outputting buffered input data;

echo clock generator means receiving a data clock at a frequency and sequentially generating an echo clock at twice the frequency; and input data transmission means receiving the buffered input data and the echo clock and generating clocked input data synchronously with the echo clock.

44. A computer system as in claim 43, in which the echo clock generator means receives:

an enable signal for enabling the generation of the echo clock; and a burst length count for determining a number of echo clocks sequentially generated by the echo clock generator means.

45. A computer system as in claim 44, wherein the echo clock generator means further comprises:

echo clock buffer means generating a buffered data clock signal in response to the data clock and the enable signal;

burst length counter means, receiving the burst length count and the echo clock, for counting the number of sequential echo clocks and generating a burst end signal when the number of sequential echo clocks corresponds to the burst length count; and burst clock generating means, responsive to the buffered data clock signal and the burst end signal, for generating the number of sequential echo clocks corresponding to the burst length count.

46. A computer system as in claim 45, wherein the burst clock generating means comprises:

latch means having inputs coupled to the buffered data clock signal and the burst end signal and an output that generates a pulse enable signal; and echo pulse generator means for generating the number of sequential echo clocks corresponding to the burst length count in response to the buffered data clock signal and the pulse enable signal.

47. A computer system as in claim 45, wherein the echo clock generator means further comprises:

reset means for resetting the burst length counter means when the number of sequential echo clocks corresponding to the burst length count has been generated.

48. A computer system as in claim 45, wherein the echo clock buffer means comprises:

lower current mirror means for detecting the voltage of the data clock based on a lower reference voltage, and producing a first output signal;

upper current mirror means for detecting the voltage of the data clock based on an upper reference voltage which is higher than the lower reference voltage, and producing a second output signal; and buffer latch means coupled to the first and second output signals, for generating the buffered data clock signal, wherein the buffered data clock signal is transited when the voltage of the data clock decreases to below the lower reference voltage or increases to above the upper reference voltage.

49. A computer system as in claim 44, wherein the processing unit is coupled to a plurality of the semiconductor memory devices.

\* \* \* \* \*